(12) United States Patent
Li et al.

(10) Patent No.: US 10,998,532 B2
(45) Date of Patent: May 4, 2021

(54) DISPLAY SUBSTRATE, MANUFACTURING METHOD OF DISPLAY SUBSTRATE AND DISPLAY DEVICE

(71) Applicant: BOE Technology Group Co., Ltd., Beijing (CN)

(72) Inventors: Yansong Li, Beijing (CN); Haidong Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/196,276

(22) Filed: Nov. 20, 2018

(65) Prior Publication Data

US 2019/0372060 A1 Dec. 5, 2019

(30) Foreign Application Priority Data

May 30, 2018 (CN) .......................... 201810540194.2

(51) Int. Cl.
*H01L 51/56* (2006.01)
*H01L 27/32* (2006.01)
(Continued)

(52) U.S. Cl.
CPC .......... *H01L 51/56* (2013.01); *H01L 27/3206* (2013.01); *H01L 27/326* (2013.01);
(Continued)

(58) Field of Classification Search
CPC ... H01L 51/56; H01L 27/326; H01L 27/3244; H01L 27/3218; H01L 27/3206;
(Continued)

(56) References Cited

U.S. PATENT DOCUMENTS 8,946,735 B2 * 2/2015 Lee ..................... H01L 51/5265
257/40
9,059,431 B2 * 6/2015 Lee ..................... H01L 51/5265
(Continued)

FOREIGN PATENT DOCUMENTS

| CN | 103811525 A | 5/2014 |
| CN | 105622618 A | 6/2016 |
| CN | 107359279 A | 11/2017 |

OTHER PUBLICATIONS

First office action of Chinese application No. 201810540194.2 dated Feb. 25, 2020.
(Continued)

*Primary Examiner* — Matthew L Reames
(74) *Attorney, Agent, or Firm* — Fay Sharpe LLP

(57) ABSTRACT

A display substrate, a manufacturing method thereof, and a display device are provided. The display substrate includes: a base substrate; an anode conductive layer; a cathode conductive layer, wherein the cathode conductive layer and the anode conductive layer are at a same side in a thickness direction of the base substrate; and an organic functional layer between the anode conductive layer and the cathode conductive layer, wherein the display substrate comprises first sub-pixel units and second sub-pixel units that are different in color category, the organic functional layer in the first sub-pixel units comprises a first light-emitting layer, the organic functional layer in the second sub-pixel units comprises the first light-emitting layer, a first electron blocking layer and a second light-emitting layer that are sequentially laminated in a direction away from the anode conductive layer, and a light-emitting color of the first light-emitting layer is different from a light-emitting color of the second light-emitting layer.

20 Claims, 8 Drawing Sheets

(51) Int. Cl.
*H01L 51/50* (2006.01)
*H01L 51/52* (2006.01)
*H01L 51/00* (2006.01)

(52) U.S. Cl.
CPC ...... *H01L 27/3211* (2013.01); *H01L 27/3218* (2013.01); *H01L 27/3244* (2013.01); *H01L 51/5044* (2013.01); *H01L 51/5096* (2013.01); *H01L 51/5265* (2013.01); *H01L 51/001* (2013.01); *H01L 51/0011* (2013.01)

(58) Field of Classification Search
CPC ............. H01L 27/3211; H01L 51/5044; H01L 51/5096; H01L 51/5265; H01L 51/001; H01L 51/0011
See application file for complete search history.

(56) References Cited

U.S. PATENT DOCUMENTS

| | | | |
|---|---|---|---|
| 9,406,907 B2* | 8/2016 | Lee | C07D 487/14 |
| 2014/0131674 A1* | 5/2014 | Park | H01L 27/3209 257/40 |
| 2015/0099322 A1 | 4/2015 | Park et al. | |
| 2015/0144926 A1* | 5/2015 | Lee | H01L 51/5044 257/40 |
| 2015/0311463 A1* | 10/2015 | Park | H01L 51/5004 257/40 |
| 2016/0149142 A1 | 5/2016 | Kim et al. | |

OTHER PUBLICATIONS

Second office action of Chinese application No. 201810540194.2 dated Sep. 8, 2020.

* cited by examiner

DISPLAY SUBSTRATE, MANUFACTURING METHOD OF DISPLAY SUBSTRATE AND DISPLAY DEVICE

This application claims priority to Chinese Patent Application No. 201810540194.2, filed with on May 30, 2018 and titled "DISPLAY SUBSTRATE, MANUFACTURING METHOD OF DISPLAY SUBSTRATE AND DISPLAY DEVICE", the entire contents of which are incorporated in the present disclosure by reference.

TECHNICAL FIELD

The present disclosure relates to a display substrate, a manufacturing method thereof, and a display device.

BACKGROUND

OLED (Organic Light Emitting Diode) displays are one of the research focus in the field of displays. Compared with a liquid crystal display, an OLED display has the advantages of lower energy consumption, lower production cost, self-illumination, a wider viewing angle, higher response speed, and the like.

SUMMARY

The present disclosure provides a display substrate, a manufacturing method thereof, and a display device.

In a first aspect, the present disclosure provides a display substrate, comprising: a base substrate; an anode conductive layer; a cathode conductive layer, wherein the cathode conductive layer and the anode conductive layer are at a same side in a thickness direction of the base substrate; and an organic functional layer between the anode conductive layer and the cathode conductive layer, wherein the display substrate comprises first sub-pixel units and second sub-pixel units that are different in color category, the organic functional layer in the first sub-pixel units comprises a first light-emitting layer, the organic functional layer in the second sub-pixel units comprises the first light-emitting layer, a first electron blocking layer and a second light-emitting layer that are sequentially laminated in a direction away from the anode conductive layer, and a light-emitting color of the first light-emitting layer is different from a light-emitting color of the second light-emitting layer.

In a possible implementation, the display substrate further comprises a third sub-pixel unit, wherein a color category of the third sub-pixel units is different from color categories of the first sub-pixel units and the second sub-pixel units, the organic functional layer in the third sub-pixel units comprises the first light-emitting layer, a second electron blocking layer and a third light-emitting layer that are sequentially laminated in the direction away from the anode conductive layer, and a light-emitting color of the third light-emitting layer is different from the light-emitting colors of the first light-emitting layer and the second light-emitting layer.

In a possible implementation, the organic functional layer further comprises a third electron blocking layer, and the third electron blocking layer is at a side, close to the anode conductive layer, of the first light-emitting layer, and covers an effective display area of the display substrate.

In a possible implementation, the first light-emitting layer covers an effective display area of the display substrate.

In a possible implementation, the first light-emitting layer is made from an electroluminescent material of which a hole mobility is greater than an electron mobility.

In a possible implementation, the display substrate further comprises a reflecting layer at an side, away from the cathode conductive layer, of the anode conductive layer.

In a possible implementation, the cathode conductive layer is configured for partial transmission and partial reflection of light emitted by the organic functional layer, in the first sub-pixel units, a film thickness between the cathode conductive layer and the reflecting layer is a first thickness to enable light emitted from the first sub-pixel units is in the color category of the first sub-pixel unit, in the second sub-pixel units, a film thickness between the cathode conductive layer and the reflecting layer is a second thickness, to enable light emitted from the second sub-pixel units is in the color category of the second sub-pixel unit, and in the third sub-pixel units, a film thickness between the cathode conductive layer and the reflecting layer is a third thickness, to enable light emitted from the third sub-pixel units is in the color category of the third sub-pixel unit.

In a possible implementation, materials for forming the first light-emitting layer, the second light-emitting layer and the third light-emitting layer comprise electroluminescent materials.

In a possible implementation, materials for forming the first light-emitting layer and the second light-emitting layer comprise electroluminescent materials.

In a possible implementation, the organic functional layer further comprises a third electrons blocking layer at a side, close to the anode conductive layer, of the first light-emitting layer.

In a possible implementation, the third electron blocking layer covers an effective display area of the display substrate.

In a possible implementation, the first light-emitting layer covers an effective display area of the display substrate.

In a possible implementation, the first light-emitting layer is made from an electroluminescent material of which a hole mobility is greater than an electron mobility.

In a second aspect, the present disclosure further provides a manufacturing method of a display substrate, comprising: forming an anode conductive layer on a base substrate; forming an organic functional layer; forming a cathode conductive layer, the cathode conductive layer and the anode conductive layer being at the same side in a thickness direction of the substrate, and the organic functional layer being between the anode conductive layer and the cathode conductive layer, wherein said forming the organic functional layer comprises: forming a first light-emitting layer, the display substrate comprising first sub-pixel units and second sub-pixel units that are different in color category, and the organic functional layer in the first sub-pixel units comprising the first light-emitting layer; forming a pattern, which comprises a first electron blocking layer, on the first light-emitting layer; and forming a pattern, which comprises a second light-emitting layer, on the first electron blocking layer, wherein a light-emitting color of the first light-emitting layer is different from a light-emitting of the second light-emitting layer, and in the second sub-pixel units, the first light-emitting layer, the first electron blocking layer and the second light-emitting layer are sequentially laminated in a direction away from the anode conductive layer.

In a possible implementation, said forming the first light-emitting layer comprises: forming the first light-emitting layer that covers an effective display area of the display substrate by adopting an open mask process.

In a third aspect, the present disclosure further provides a display device, comprising any one of the display substrates described above.

DETAILED DESCRIPTION OF THE DRAWINGS

DETAILED DESCRIPTION

The present disclosure will be described in further detail with reference to the accompanying drawings, to present the objects, technical solutions, and advantages of the present disclosure clearer.

In the related art, manufacture of an OLED product depends on an FMM (Fine Metal Mask) process. However, the fine metal mask plate is very difficult to manufacture. Besides, the more the steps of the EMM process during manufacture, the more easily a product becomes defective.

Figure 1:
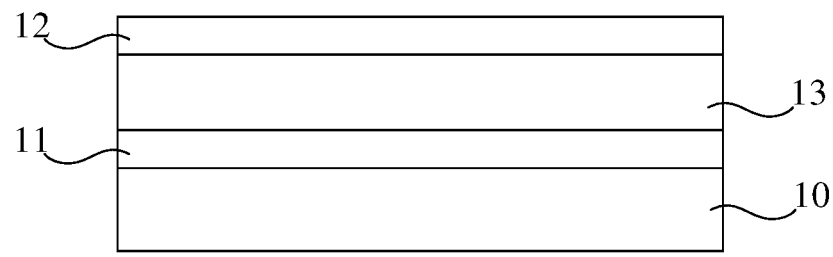
FIG. 1 is a structural schematic diagram of a display substrate according to an embodiment of the present disclosure.

FIG. 1 is a structural schematic diagram of a display substrate according to an embodiment of the present disclosure. Referring to FIG. 1, the display substrate includes a base substrate 10, an anode conductive layer 11, a cathode conductive layer 12 and an organic functional layer 13. The anode conductive layer 12, the cathode conductive layer 12 and the organic functional layer 13 are all above the base substrate 10 (the cathode conductive layer 12 and the organic functional layer 13 are at the same side in the thickness direction of the base substrate 10). The organic functional layer 13 is between the anode conductive layer 11 and the cathode conductive layer 12. It should be understood that the display substrate provided in the embodiments of the present disclosure may be a display panel of any electroluminescent display or a component of the display panel, and may be, such as, an OLED display panel, a quantum dot light-emitting display panel, an active matrix backboard, a touch display panel and the like and may not be limited thereto. It should also be understood that FIG. 1 only takes that the anode conductive layer 11 is closer to the base substrate 10 than the cathode conductive layer 12 as an example. The anode conductive layer 11 may be farther away from the base substrate 10 than the cathode conductive layer 12 within a possible range.

Figure 2:
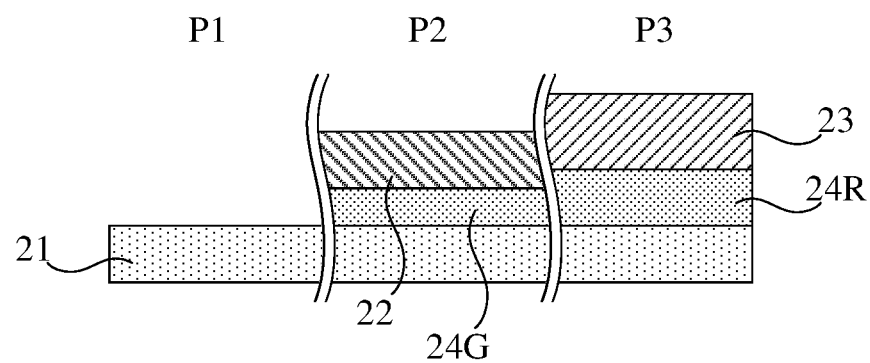
FIG. 2 is a structural schematic diagram of an organic functional layer in the display substrate shown in FIG. 1.

FIG. 2 is a structural schematic diagram of the organic functional layer in the display substrate shown in FIG. 1. Referring to FIG. 2, the display substrate includes first sub-pixel units P1, second sub-pixel units P2 and third sub-pixel units P3 with different color categories (for example, the color categories are blue, green and red respectively, or, white, green and red respectively, or blue, yellow and red respectively, and may be not limited thereto). In an example, every two adjacent sub-pixel units are separated by a spacer in a pixel define layer (PLD). In yet another example, each row of sub-pixel units has the same color category, and every two adjacent rows of sub-pixel units are separated by a spacer in the pixel define layer. The organic functional layer 13 in the first sub-pixel units P1 includes a first light-emitting layer 21. The organic functional layer 13 in the second sub-pixel units P2 includes the first light-emitting layer 21, a first electron blocking layer 24G and a second light-emitting layer 22 that are sequentially laminated in the direction away from the anode conductive layer 11. The organic functional layer 13 in the third sub-pixel units P3 includes the first light-emitting layer 21, a second electron blocking layer 24R and a third light-emitting layer 23 that are sequentially laminated in the direction away from the anode conductive layer 11. The first light-emitting layer 21, the second light-emitting layer 22 and the third light-emitting layer 23 have different light colors from each other.

It should be understood that the organic functional layer 13 includes the first light-emitting layer 21 in all of the first sub-pixel units P1, the second sub-pixel units P2 and the third sub-pixel units P3. Thus, the first light-emitting layer 21 may be manufactured by a process of which the accuracy and the difficulty are lower than those of the fine metal mask (FMM) process, for example, an open mask process (a process that forms a film or layer in the entire effective display area of the display substrate). It should also be understood that the first electron blocking layer 24G and the second electron blocking layer 24R may be made from, for example, a material of which the hole mobility is greater than the electron mobility, and the first electron blocking layer 24G and the second electron blocking layer 24R may be formed with reference to the manufacturing method of an electron blocking layer in the related art. It should further be understood that the first electron blocking layer 24G and the second electron blocking layer 24R in the example illustrated by FIG. 2 have different thicknesses, but they may have the same thickness in other possible implementations. Taking this as an example, the thickness relationships among the layer structures, shown in the form of a pattern in the text, are exemplary and may be adjusted in accordance with the application requirements during specific implementations, which is not be limited in the present disclosure.

Figure 3:
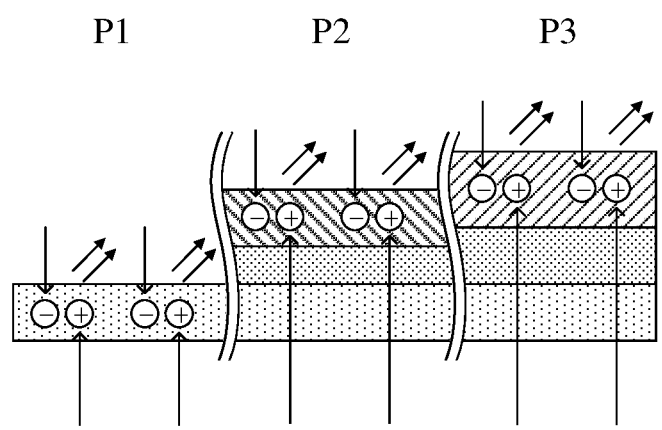
FIG. 3 is a schematic diagram of a light-emitting principle of a display substrate according to an embodiment of the present disclosure.

FIG. 3 is a schematic diagram of a light-emitting principle of a display substrate according to an embodiment of the present disclosure. Referring to FIG. 1 and FIG. 3, since the anode conductive layer 11 is below the organic functional layer 13, and while the cathode conductive layer 12 is on the organic functional layer 13, electrons in the organic functional layer 13 migrate from top to bottom while holes migrate from bottom to top. The first light-emitting layer 21, the second light-emitting layer 22 and the third light-emitting layer 23 may emit light when an electron-hole pair (formed by compounding an electron and a hole) is formed therein. As shown in FIG. 3, in the first sub-pixel units P1, the electrons (represented by "−") that migrate from top to bottom and the holes (represented by "+") that migrate from bottom to top may be compounded in the first light-emitting layer 21 to enable the first sub-pixel units P1 to emit light. In the second sub-pixel units P2, the first electron blocking layer 24G may prevent electrons from migrating from top to bottom, such that the first light-emitting layer 21 mainly plays a role of transmitting holes. Thus, the second light-emitting layer 22 emits light, and while the first light-emitting layer 21 does not emit light. In the third sub-pixel units P3, the second electron blocking layer 24R can prevent electrons from migrating from top to bottom, such that the first light-emitting layer 21 mainly plays a role of transmitting holes. Thus, the third light-emitting layer 23 emits light, and while the first light-emitting layer 21 does not emit light. It can be understood that if the first electron blocking layer 24G is removed, the first light-emitting layer 21 in the second sub-pixel units P2 may emit light simultaneously with the second light-emitting layer 22, such that a light-emitting color of the second light-emitting layer 22 is mixed with the light-emitting color of the first light-emitting layer 21 (color mixing), which affects the color purity of the second sub-pixel units P2 and display performance of the display substrate. If the second electron blocking layer 24R is removed, the first light-emitting layer 21 in the third sub-pixel units P3 may emit light simultaneously with the third light-emitting layer 23, such that a light-emitting color of the third light-emitting layer 23 is mixed with the light-emitting color of the first light-emitting layer 21 (color mixing), which affects the color purity of the third sub-pixel units P3 and the display performance of the display substrate.

It can be seen that the electron blocking layers between different light-emitting layers in each sub-pixel unit may play the role of enabling the light-emitting layer that is close to the cathode conductive layer to emit light. Based on this, in the embodiments of the present disclosure, during manufacturing the first light-emitting layer 21, a simpler process may be adopted to replace the FMM process without obviously influencing light-emitting effects of other light-emitting layers. Thus, the use frequency of the FMM process may be reduced without causing the defect of color mixing, which helps to improve the display performance and reduce the manufacturing difficulty of an OLED product.

It should be understood that for the display substrate of which the sub-pixel units have only two color categories, based on the same inventive concept, in the display panel, the organic functional layer 13 in the first sub-pixel units P1 can include the first light-emitting layer 21, and the organic functional layer 13 in the second sub-pixel units P2 can include the first light-emitting layer 21, the first electron blocking layer 24G and the second light-emitting layer 22 that are sequentially laminated in the direction away from the anode conductive layer 11, such that the use frequency of the FMM process may be reduced without causing the defect of color mixing, which helps to improve the display performance and reduce the manufacturing difficulty of the OLED product.

Figure 4:
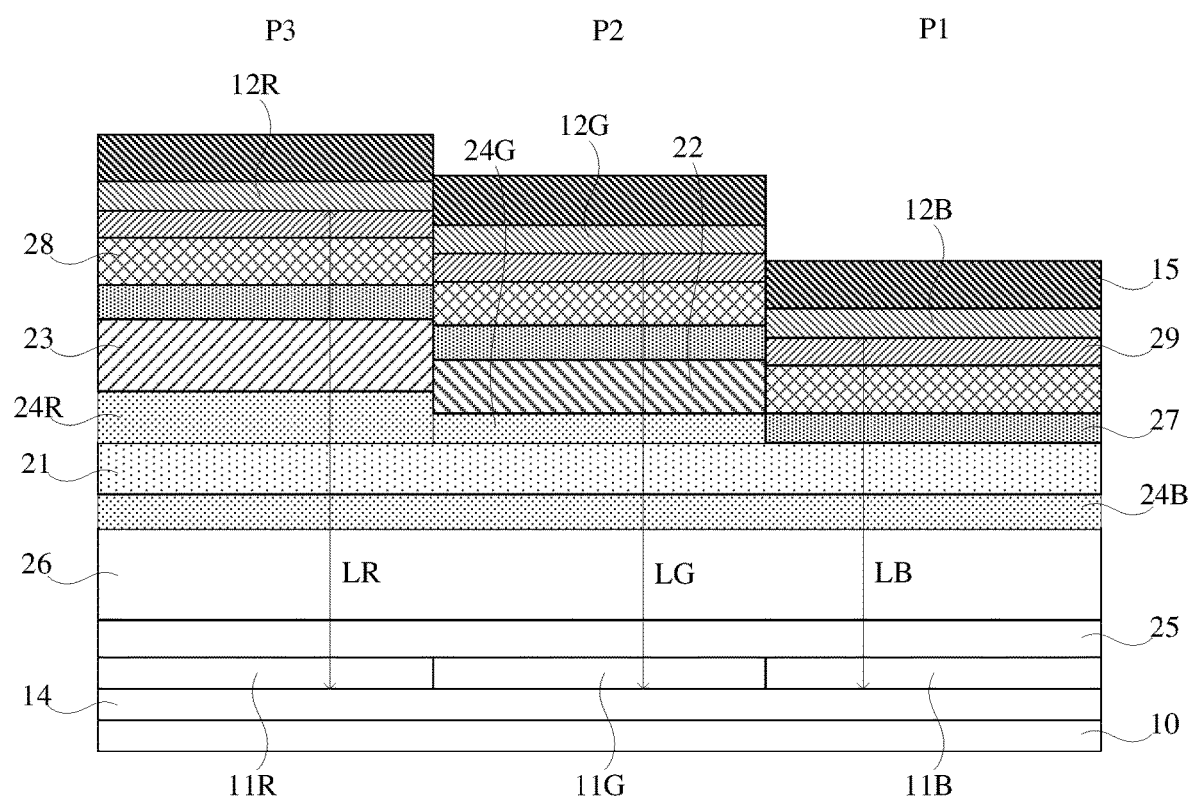
FIG. 4 is a structural schematic diagram of a display substrate according to another embodiment of the present disclosure.

FIG. 4 is a structural schematic diagram of a display substrate according to yet another embodiment of the present disclosure. In the embodiments of the present disclosure, the first sub-pixel unit P1 is a blue sub-pixel unit. The second sub-pixel unit P2 is a green sub-pixel unit. The third sub-pixel unit P3 is a red sub-pixel unit. The first light-emitting layer 21 is a blue organic light-emitting layer. The second light-emitting layer 22 is a green organic light-emitting layer. The third light-emitting layer 23 is a red organic light-emitting layer. Referring to FIG. 4, besides the first light-emitting layer 21, the second light-emitting layer 22, the third light-emitting layer 23, the first electron blocking layer 24G and the second electron blocking layer 24R, the organic functional layer further includes a hole injection layer 25, a hole transmitting layer 26, a hole blocking layer 27, an electron transmitting layer 28 and an electron injection layer 29. In FIG. 4, the anode conductive layer 11 in the display substrate includes a pixel electrode 11B in the first sub-pixel unit P1, a pixel electrode 11G in the second sub-pixel unit P2 and a pixel electrode 11R located in the third sub-pixel unit P3. The cathode conductive layer 12 includes a first cathode 12B in the first sub-pixel unit P1, a second cathode 12G in the second sub-pixel unit P2, and a third cathode 12R in the third sub-pixel unit P3. The display substrate further includes a reflecting layer 14 on the side, away from the cathode conductive layer 12, of the anode conductive layer 11, as well as a light extraction layer 15 located on the side, away from the anode conductive layer 11, of the cathode conductive layer 12.

In an example, the structure shown in FIG. 4 is manufactured by the following processes.

Manufacture of the reflecting layer 14: the reflecting layer 14 that covers an effective display area of the display substrate is manufactured with a metal material by, for example, a magnetron sputtering process or a chemical vapor deposition process (an open mask process may be adopted). The metal material may be, for example, at least one of silver, copper, molybdenum and nickel. All parameters (material, thickness and surface evenness) of the reflecting layer 14 may be set according to the rule that the reflecting layer 14 has a high reflectivity to light from above, and may not be limited thereto.

Manufacture of the anode conductive layer 11: the anode conductive layer 11 is manufactured by forming a layer of a transparent conductive film with a transparent conductive material by, for example, the magnetron sputtering process or the chemical vapor deposition process and performing selective etching on the transparent conductive film by a patterning process to form a pattern that includes the pixel electrode 11B, the pixel electrode 11G and the pixel electrode 11R. The transparent conductive material may include, for example, ITO($In_2O_3$:$SnO_2$), IZO($In_2O_3$:ZnO), GITO ($Ga_{0.08}In_{0.28}Sn_{0.64}O_3$) and ZITO($Zn_{0.64}In_{0.88}Sn_{0.66}O_3$).

Manufacture of the hole injection layer 25: the hole injection layer 25 is formed by a vacuum evaporation process and an open mask process. The hole injection layer 25 may be made from, for example, HAT-CN, 2,3,5,6-tetrafluoro-7,7'8,8'-tetracyanoquinodimethane(F4-TCNQ) and tris(4-bromophenyl)aminium hexachloroantimonate (TBAHA). The thickness of the hole injection layer 25 may be 1 nm.

Manufacture of the hole transmitting layer 26: the hole transmitting layer 26 is formed by the vacuum evaporation process and the open mask process. The hole transmitting layer 26 may be made from, for example, N,N'-Di(naphthalen-1-yl)-N,N'-diphenyl-1,1'-biphenyl)-4,4'-diamine (NPB), a triphenyl diamine (TPD) derivative, TPTE and 1,3,5-tri(N-3-methylphenyl-N-phenylamino)benzene (TDAB). The thickness of the hole transmitting layer 26 may be 100-130 nm.

Manufacture of the third electron blocking layer 24B: the third electron blocking layer 24B is formed by the vacuum evaporation process and the open mask process. The third electron blocking layer 24B may be made from a material of which the HOMO (Highest Occupied Molecular Orbital) energy level matches with that of the hole transmitting layer 26 and the LUMO (Lowest Unoccupied Molecular Orbital)

energy level is relatively higher, and may be, for example, 2-(4-tert-Butylphenyl)-5-(4-biphenylyl)-1,3,4-diazole and 3-(Biphenyl-4-yl)-5-(4-tert-butylphenyl)-4-phenyl-4H-1,2,4-triazole. The thickness of the third electron blocking layer 24B may be, for example, 5-10 nm.

Manufacture of the first light-emitting layer 21: a blue organic light-emitting layer is manufactured by the vacuum evaporation process and the open mask process. The first light-emitting layer 21 may be made from a blue organic luminescent material of which the hole mobility is greater than the electron mobility (for example, the hole mobility is two or more orders of magnitude greater than the electron mobility), and may also be made from, for example, 3-tert-Butyl-9,10-di(2-naphthyl) anthracene, 2-methyl-9,10-bis(naphthalen-2-yl)anthracene and (2,2-diphenylvinyl)-1,1c-biphenyl. The thickness of the first light-emitting layer 21 may be, for example, 0-30 nm.

Manufacture of the first electron blocking layer 24G: the first electron blocking layer 24G is formed by the FMM process. The first electron blocking layer 24G may be made from a material of which the HOMO energy level matches with that of the first light-emitting layer 21 and the LUMO energy level is relatively higher, or a material of which the hole mobility is greater than the electron mobility (for example, the hole mobility is two or more orders of magnitude higher than the electron mobility). The thickness of the first electron blocking layer 24G may be, for example, 10-30 nm.

Manufacture of the second light-emitting layer 22: a green organic light-emitting layer is manufactured light-emitting layer by the FMM process. The second light-emitting layer 22 may be made from, for example, tris(2-phenylpyridine) iridium(III) or iridium compounds. The thickness of the green organic light-emitting layer may be 20-40 nm.

Manufacture of the second electron blocking layer 24R: the second electron blocking layer 24 is formed by the FMM process. The second electron blocking layer 24 may be made from a material of which the HOMO energy level matches with that of the first light-emitting layer 21 and the LUMO energy level is relatively higher, or a material of which the hole mobility is greater than the electron mobility (for example, the hole mobility is two or more orders of magnitude higher than the electron mobility). The thickness of the second electron blocking layer 24 may be, for example, 40-70 nm.

Manufacture of the third light-emitting layer 23: a red organic light-emitting layer is manufactured by the FMM process. The third light-emitting layer 23 may be made from, for example, Bis[2-(2'-benzo-4,5–alpha-thienyl)pyridine] acetylacetonate iridium, 4,4',4"-tris(N-carbazol)triphenylamine, tris(1-phenylisoquinoline)iridium(III) and tris[1-phenylisoquinolinato-C2,N]iridium. The thickness of the third light-emitting layer 23 may be 20-40 nm.

Manufacture of the hole blocking layer 27: the hole blocking layer 27 is formed by the open mask process. The hole blocking layer 27 may be made from, for example, 1,3,5-tris(1-phenyl-1H-benzimidazol-2-yl)benzene. The thickness of the hole blocking layer 27 may be 1-10 nm.

Manufacture of the electron transmitting layer 28: the electron transmitting layer 28 is formed by the open mask process. The electron transmitting layer 28 may be made from, for example, 2-(4-biphenylyl)-5-phenyl–1,3,4-oxadiazole (PBD), 2,5-Di(1-naphthyl)-1,3,5-oxadiazole (BND) and 2,4,6-triphenoxy-1,3,5-triazine (TRZ). The thickness of the electron transmitting layer 28 may be 10-40 nm.

Manufacture of the electron injection layer 29: the electron injection layer 29 is formed by the open mask process. The electron injection layer 29 may be made from, for example, an alkali metal fluoride MF (M may be selected from Li, Na, K, Rb, Cs, etc.), $Li_2O$, $LiBO_2$. The thickness of the electron injection layer 29 may be 5-10 nm.

Manufacture of the cathode conductive layer 12: a film layer that includes the first cathode 12B, the second cathode 12G and the third cathode 12R is manufactured by the open mask process with a metal material. The metal material may be Mg, Ag, Al, Li, K and Ca, or their alloys MgxAg(1-x), LixAl(1-x), LixCa(1-x) and LixAg(1-x), where 0<x<1. The thickness of the cathode conductive layer 12 may be, for example, 10-20 nm.

Manufacture of the light extraction layer 15: the light extraction layer 15 is formed by the open mask process. The light extraction layer 15 may be made from, for example, ZnO, ZnS, ZnSe, $TeO_2$, $WO_3$, $MoO_3$, MgO, LiF, etc. The thickness of the light extraction layer 15 may be, for example, 20-500 nm.

It should be understood that when the organic functional layer 12 further includes the third electron blocking layer 24B at the side, close to the anode conductive layer 11, of the first light-emitting layer 21, the light-emitting efficiency of the first light-emitting layer 21 in the first sub-pixel units P1 may be improved under the action of the third electron blocking layer 24B without affecting the second sub-pixel units P2 and the third sub-pixel units P3.

It should be understood that when the third electron blocking layer 24B and/or the first light-emitting layer 21 cover the effective display area of the display substrate, the third electron blocking layer 24B and/or the first light-emitting layer 21 may be formed, for example, by the above-mentioned open mask process. Thus, the process difficulty may be reduced in comparison with the FMM process.

It should be understood that when the display substrate further includes the reflecting layer 14 at the side, away from the cathode conductive layer 12, of the anode conductive layer 11, the reflecting layer 14 may reflect light from all the light-emitting layers, such that light emitted downwards by the light-emitting layers may also be used for display, which helps to improve the display brightness and reduce the power consumption.

In an example, the cathode conductive layer 12 is configured for partial transmission and partial reflection of light emitted by the organic functional layer 13 (for example, a semi-transparent and semi-reflecting film is obtained by controlling the thickness of the metal film as the cathode conductive layer 12). The thickness between the cathode conductive layer 12 and the reflecting layer 14 in the first sub-pixel units P1 is a first thickness LB, such that light emitted from the first sub-pixel units P1 is in the color category of the first sub-pixel units P1. The thickness between the cathode conductive layer 12 and the reflecting layer 14 in the second sub-pixel units P2 is a second thickness LG, such that light emitted from the second sub-pixel units P2 is in the color category of the second sub-pixel units P2. The thickness between the cathode conductive layer 12 and the reflecting layer 14 in the third sub-pixel units P3 is a third thickness LR, such that light emitted from the third sub-pixel units P3 is in the color category of the third sub-pixel units P3. In one implementation, the first thickness LB may be, for example, 1,900 Å, such that the lower surface of the cathode conductive layer 12 and the upper surface of the reflecting layer 14 form two parallel cavity mirrors of an optical resonant cavity (the cavity length is the first thickness LB), and light exited from the upper surface of the first cathode conductive layer 12 in the first sub-pixel units P1 is blue right. Similarly, the second thickness LG may be set as 2,300 Å and the third thickness LR may be set as 2,750 Å, such that light exited from the upper surface of the first cathode conductive layer 12 in the second sub-pixel units P2 is green light, and light exited from the upper surface of the first cathode conductive layer 12 in the third sub-pixel units P3 is red light. Thus, a color filter may be omitted. The color purity of the sub-pixels of each color category is favorably improved, thereby helping realize better display performance.

It should be understood that the materials for forming the first light-emitting layer 21, the second light-emitting layer 22 and the third light-emitting layer 23 all include electroluminescent materials. Display substrates with this characteristic may adopt the methods described in the above-mentioned embodiments to realize process simplification. When the first light-emitting layer 21 is made from the electroluminescent material of which the hole mobility is greater than the electron mobility, the first light-emitting layer 21 can have good hole transmitting performance, thereby helping improve the light-emitting efficiency in the second sub-pixel units P2 and the third sub-pixel units P3. In an implementation, the light-emitting material of the first light-emitting layer 21 may be an electroluminescent material of which the hole mobility is two or more orders of magnitude greater than the electron mobility.

Figure 5:
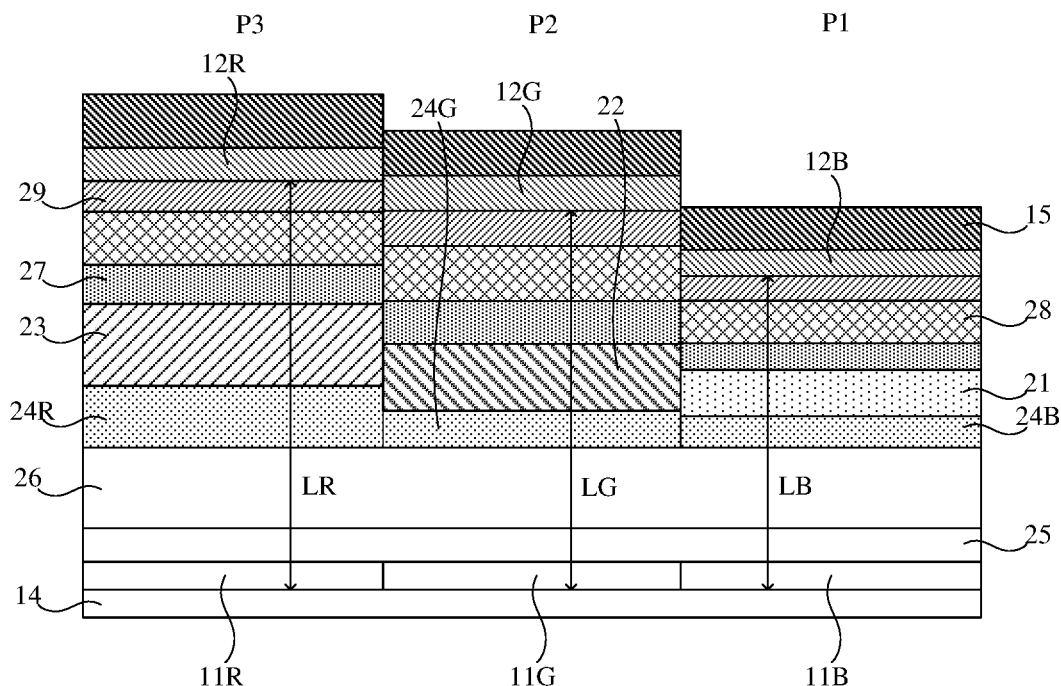
FIG. 5 is a structural schematic diagram of a display substrate in a comparative embodiment of the present disclosure.

It can be seen that in the foregoing examples, the use frequency of the FMM process may be reduced without causing the defect of color mixing, which helps to improve the display performance and reduce the manufacturing difficulty of the OLED product. As a reference, FIG. 5 is a structural schematic diagram of a display substrate in a comparison example. Comparing FIG. 4 with FIG. 5, it can be seen that the third electron blocking layer 24B and the first light-emitting layer 21 in the comparison example are only disposed in the first sub-pixel units P1, the first electron blocking layer 24G and the second light-emitting layer 22 are directly formed on the hole transmitting layer 26, and the second electron blocking layer 24R and the third light-emitting layer 23 are also directly formed on the hole transmitting layer 26. For the convenience of description, the structure of the display substrate shown in FIG. 4 is called an example structure and the structure of the display substrate shown in FIG. 5 is called a comparison structure. Compared with the comparison structure, for the example structure, the open mask process may be adopted to form the third electron blocking layer 24B and the first light-emitting layer 21, such that the manufacture of an FMM (the pattern of the FMM corresponds to that of the first light-emitting layer 21 in FIG. 5) and twice use of the FMM process are omitted.

Figure 6:
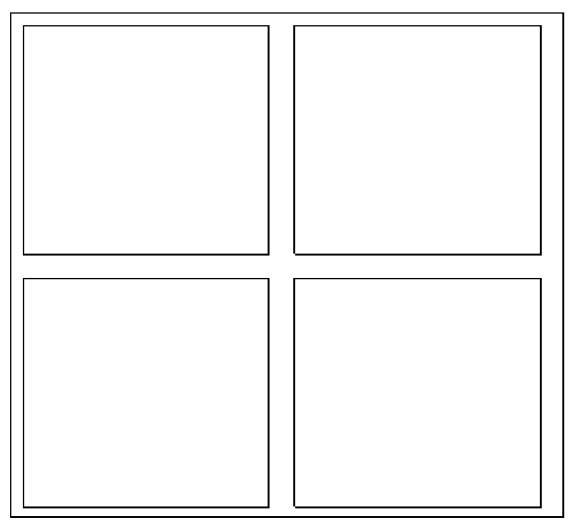
FIG. 6 is a structural schematic diagram of a mask plate for an open mask according to an embodiment of the present disclosure.
Figure 7:
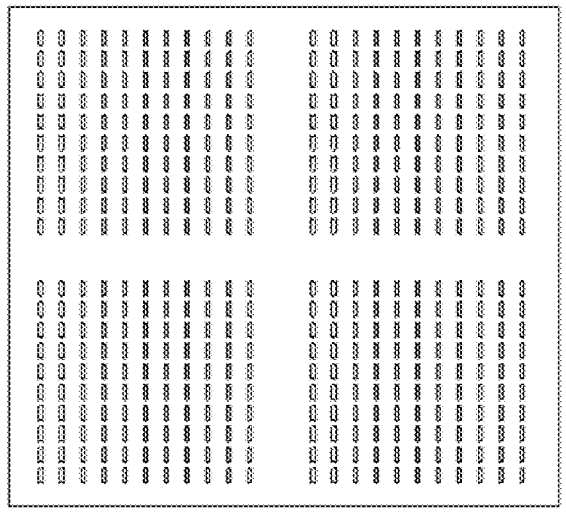
FIG. 7 is a structural schematic diagram of a mask plate for a fine metal mask according to an embodiment of the present disclosure.
Figure 8:
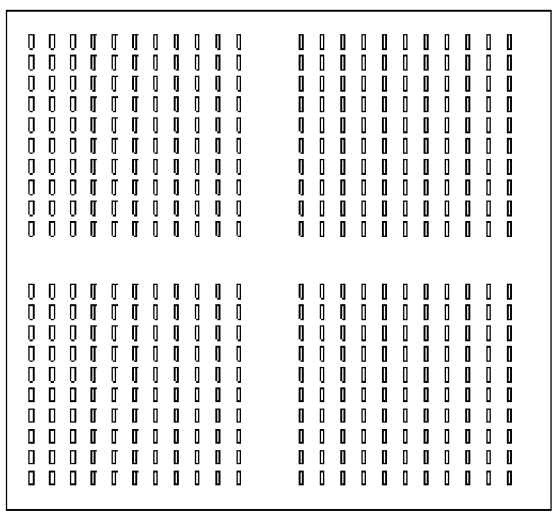
FIG. 8 is a structural schematic diagram of a mask plate for a fine metal mask according to an embodiment of the present disclosure.

In an example, FIG. 6 is a structural schematic view of a mask plate for an open mask according to an embodiment of the present disclosure. FIG. 7 and FIG. 8 are structural schematic views of mask plates for an FMM according to an embodiment of the present disclosure. In this example, the display substrate is a display panel mother board including four effective display areas (the four effective display areas are rectangular and arranged in two rows and two columns). The mask plate for the open mask, shown in FIG. 6, has four open areas (corresponding to the four effective display areas respectively), and may be used to manufacture at least one of the reflecting layer 14, the hole injection layer 25, the hole transmitting layer 26, the first electron blocking layer 24B, the first light-emitting layer 21, the hole blocking layer 27, the electron transmitting layer 28, the electron injection layer 29 and the cathode conductive layer in the foregoing manufacturing process. The mask plate for the FMM, shown in FIG. 7, may include a plurality of open areas that correspond to the second sub-pixel units P2 so as to be used to manufacture the first electron blocking layer 24G and the second light-emitting layer 22 in the foregoing manufacturing process. The mask plate for the FMM, shown in FIG. 8, may include a plurality of open areas that correspond to the third sub-pixel units P3 so as to be used to manufacture the second electron blocking layer 24R and the second light-emitting layer 23 in the foregoing manufacturing process. It can be seen that in comparison, by using the mask plate shown in FIG. 6, the accuracy of the pattern at the periphery does not need to be strictly controlled, and the mask plate for the FMM, which corresponds to the first sub-pixel units P1, does not need to be manufactured individually. Thus, the process difficulty by using the example structure is lower than that by using the comparison structure.

In the forgoing example, it should be understood that the film layer manufactured by the mask plate shown in FIG. 6 may be continuous or discontinuous. For example, the first light-emitting layer 21 manufactured by the open mask in FIG. 4 may be broken by a bulged structure below between the first sub-pixel unit P1 and the second sub-pixel unit P2, such that the first light-emitting layer 21 may cover the effective display area of the display substrate at the broken position.

It should also be understood that although the example structure may have a lower process difficulty than the comparison structure, the characteristic of the example structure may be different from that of the comparison structure correspondingly based on the difference between the two structures. In an example, when other conditions are the same (for example, the layers in the example structure and the comparison structure are made from the same material, and the example structure and the comparison structure have the same first thickness LB, the same second thickness LG and the same third thickness LR), the voltage and the current efficiency of the example structure and the comparison structure are tested. Test results are as below:

TABLE 1

Photoelectric Test Results of Comparison Structure and Example Structure

|  | Color | Voltage | Current Efficiency |
|---|---|---|---|
| Comparison Structure | Red | 100% | 100% |
|  | Green | 100% | 100% |
|  | Blue | 100% | 100% |
| Example Structure | Red | 102% | 98.2% |
|  | Green | 101% | 100.3% |
|  | Blue | 101% | 99.1% |

Figure 9:
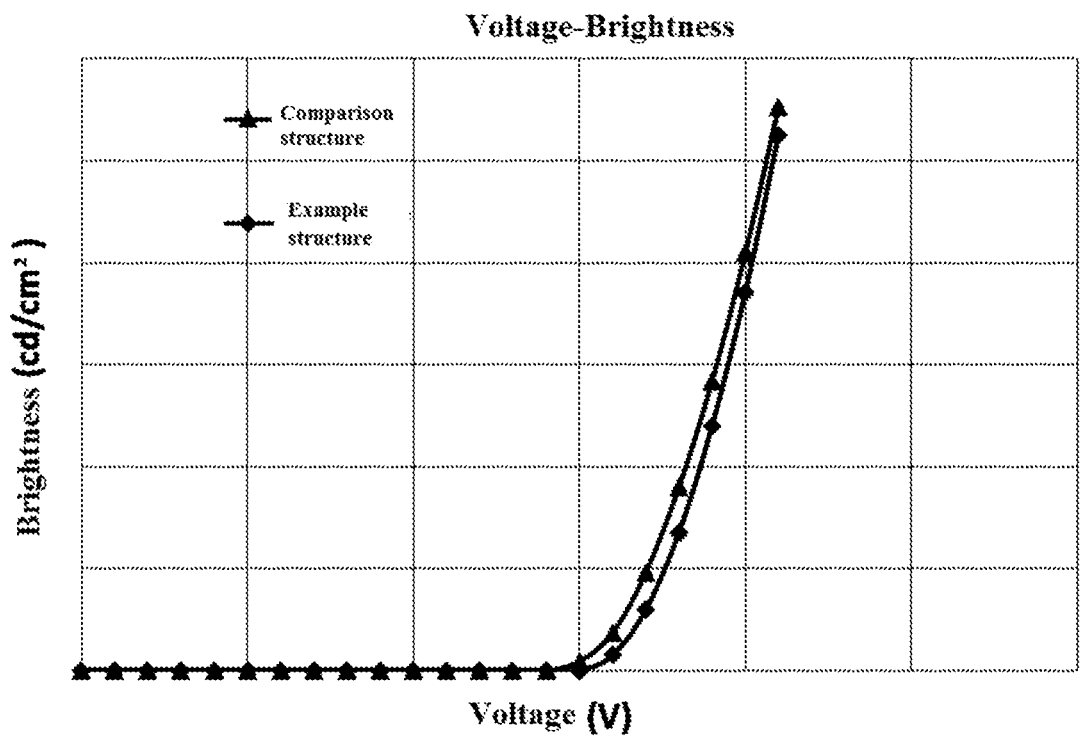
FIG. 9 to FIG. 14 are schematic diagram showing comparative test results between two display substrates according to an embodiment of the present disclosure.
Figure 10:
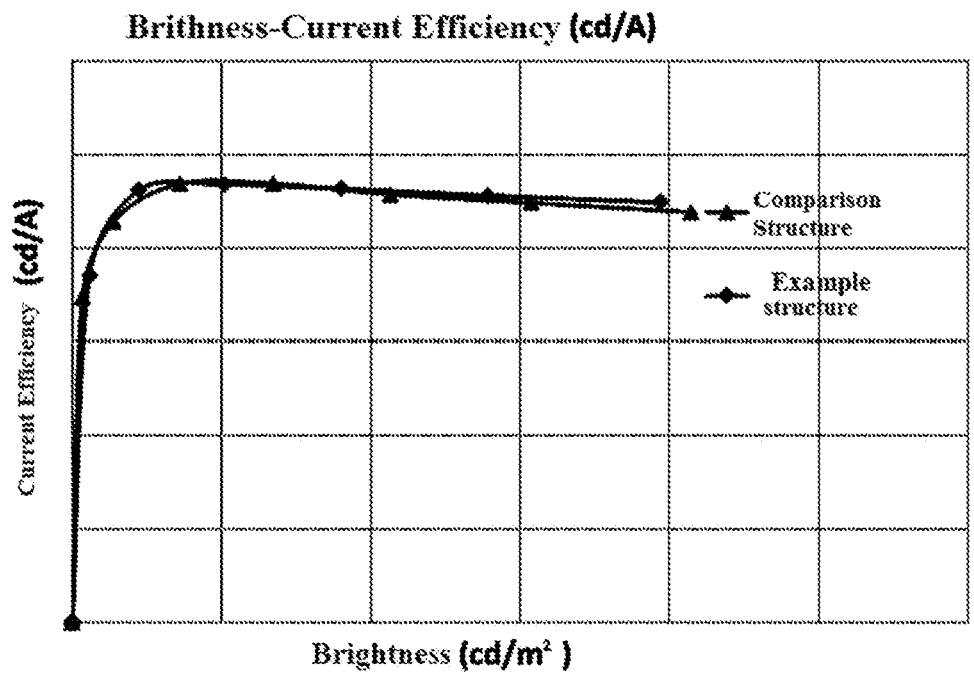
Figure 11:
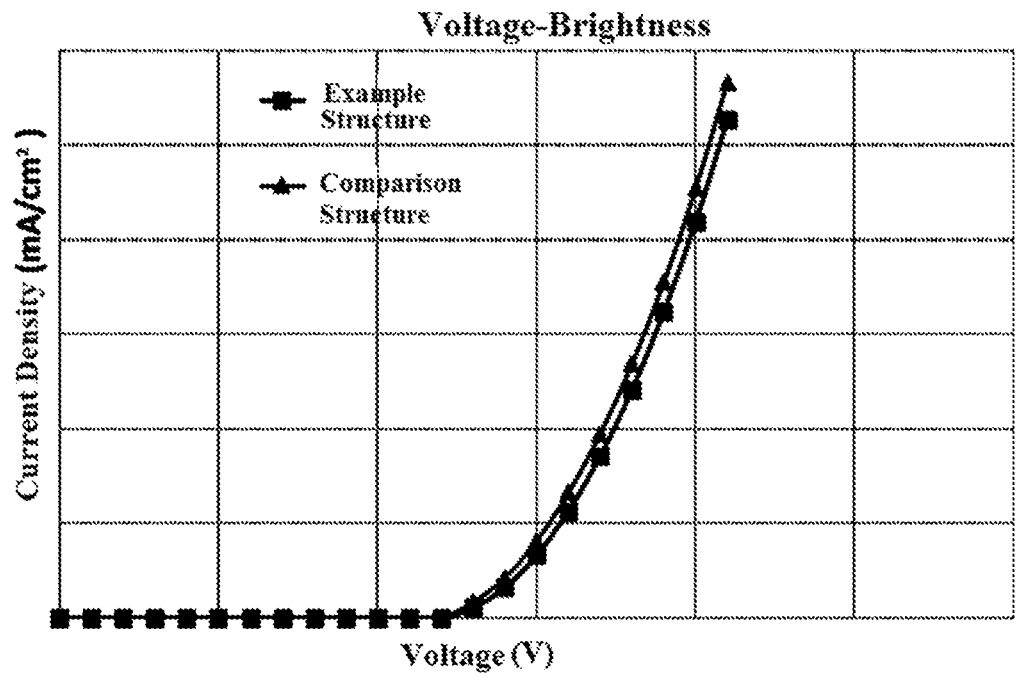
Figure 12:
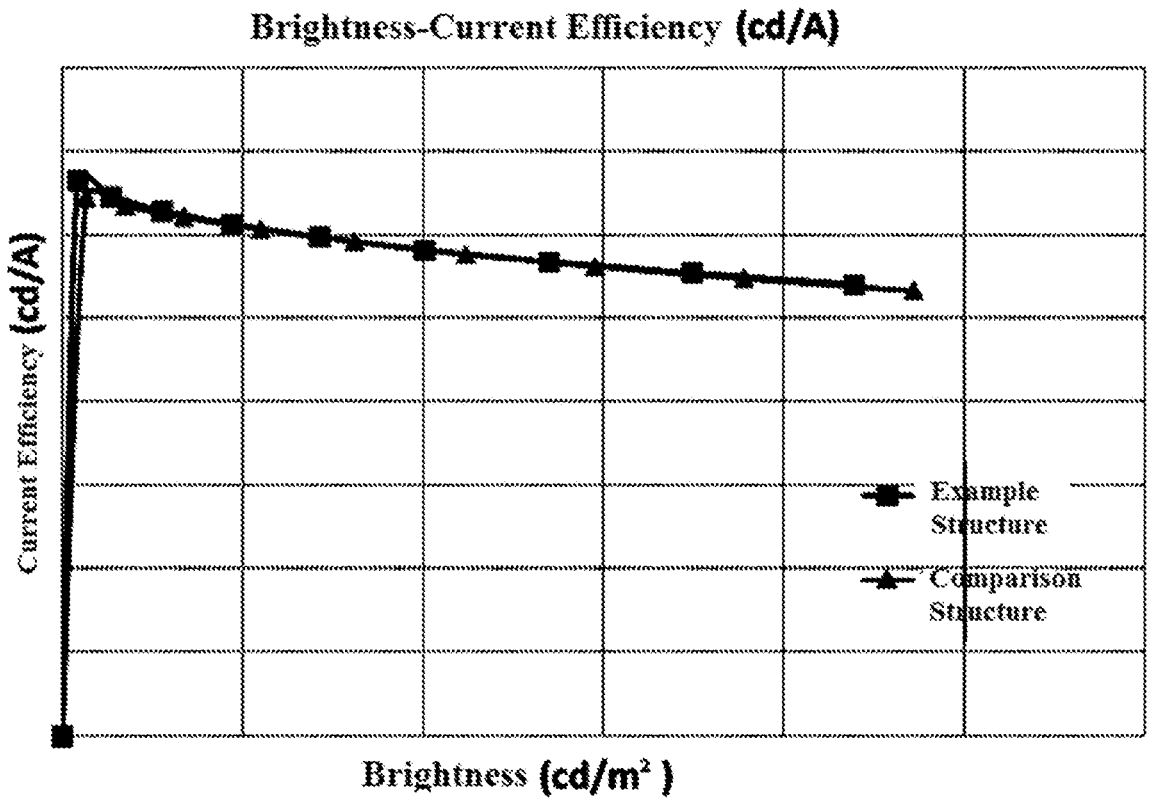
Figure 13:
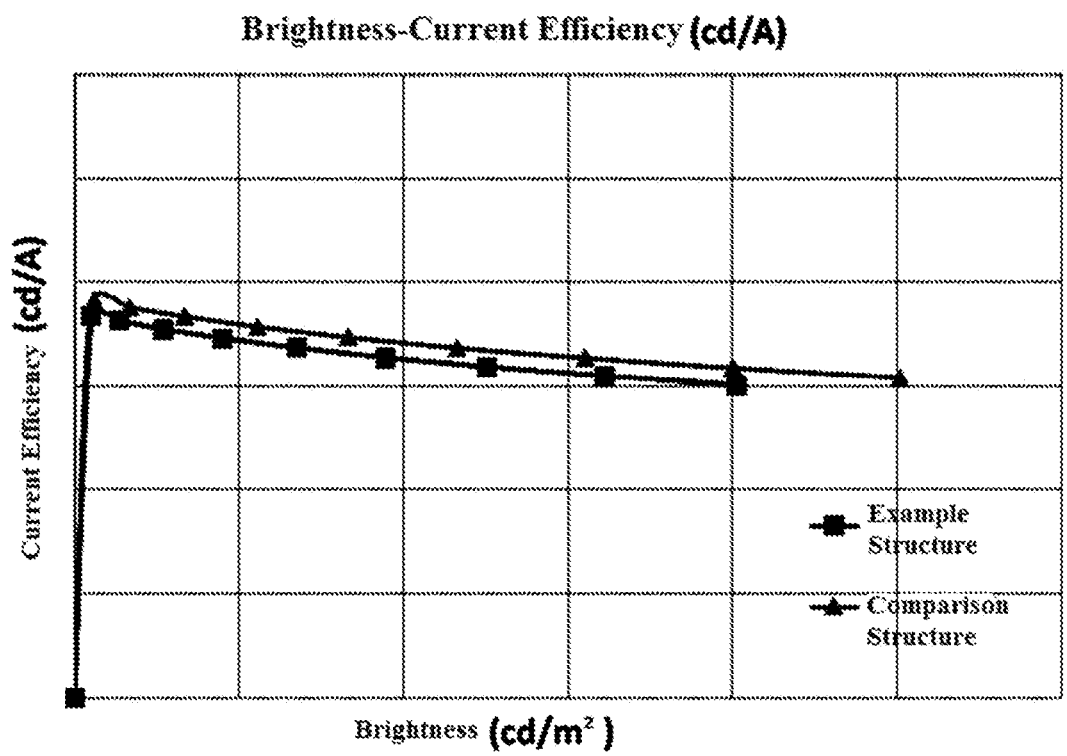
Figure 14:
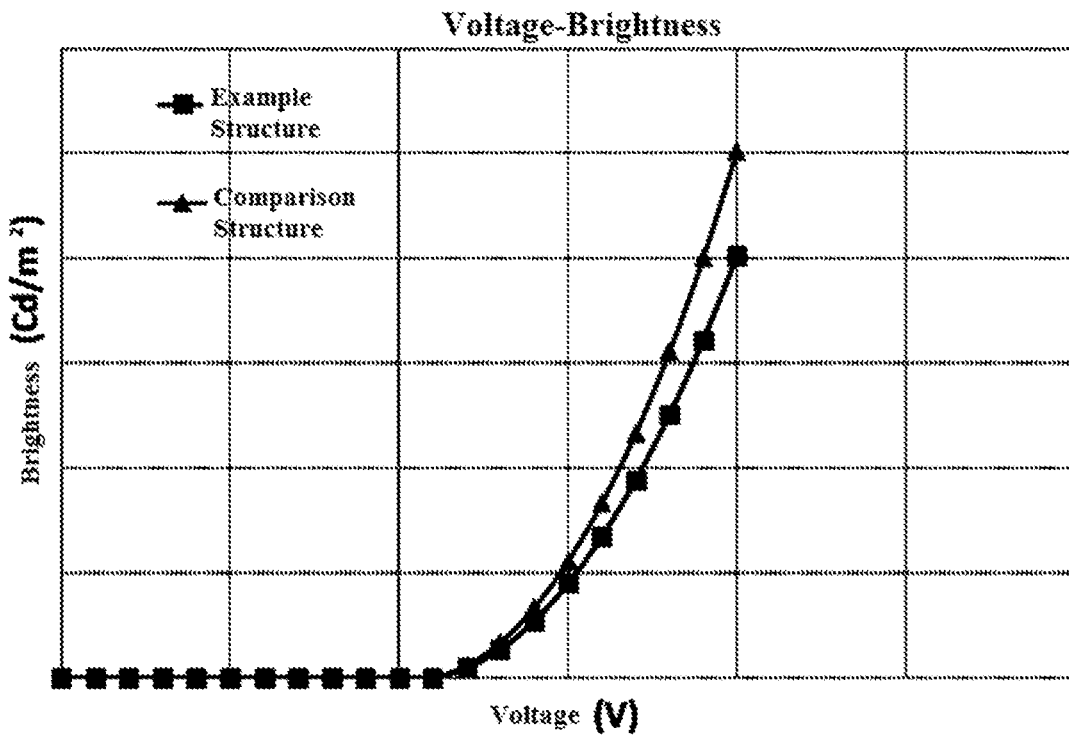

Taking the "red" row in the example structure of the above Table as an example, the voltage 102% means that when the voltage magnitude between the anode and the cathode of the comparison structure is set as 100% if a red sub-pixel emits light with a standard brightness, the voltage magnitude between the anode and the cathode of the example structure is 102% if a red sub-pixel (the third sub-pixel unit P3) emits light with the same standard brightness. The current efficiency 98.2% means that when the current efficiency of the comparison structure is set as 100% if the red sub-pixel emits light with a standard brightness, the current efficiency of the example structure is 98.2% when the red sub-pixel (the third sub-pixel unit P3) emits light with the same standard brightness. Besides, FIG. 9 shows a voltage-brightness comparison test result of sub-pixels unit with the color category of blue in the example structure and the comparison structure. FIG. 10 shows a brightness-current efficiency comparison test result of sub-pixel units with the color category of blue in the example structure and the comparison structure. FIG. 11 shows a voltage-brightness comparison test result of sub-pixel units with the color category of green in the example structure and the comparison structure. FIG. 12 shows a brightness-current efficiency comparison test result of sub-pixel units with the color category of green in the example structure and the comparison structure. FIG. 13 shows a voltage-brightness comparison test result of sub-pixel units with the color category of red in the example structure and the comparison structure. FIG. 14 shows a brightness-current efficiency comparison test result of sub-pixel units with the color category of red in the example structure and the comparison structure.

It can be seen from the above test results that comparing the example structure with the comparison structure, the optical-electrical characteristic of the example structure does not decrease significantly. That is, the example structure and the comparison structure are basically the same in optical-electrical characteristic. However, since compared with the comparison structure, the example structure can reduce the use of the FMM process, the embodiments of the present disclosure help to reduce the manufacturing difficulty and to improve the display performance of the OLED product.

Figure 15:
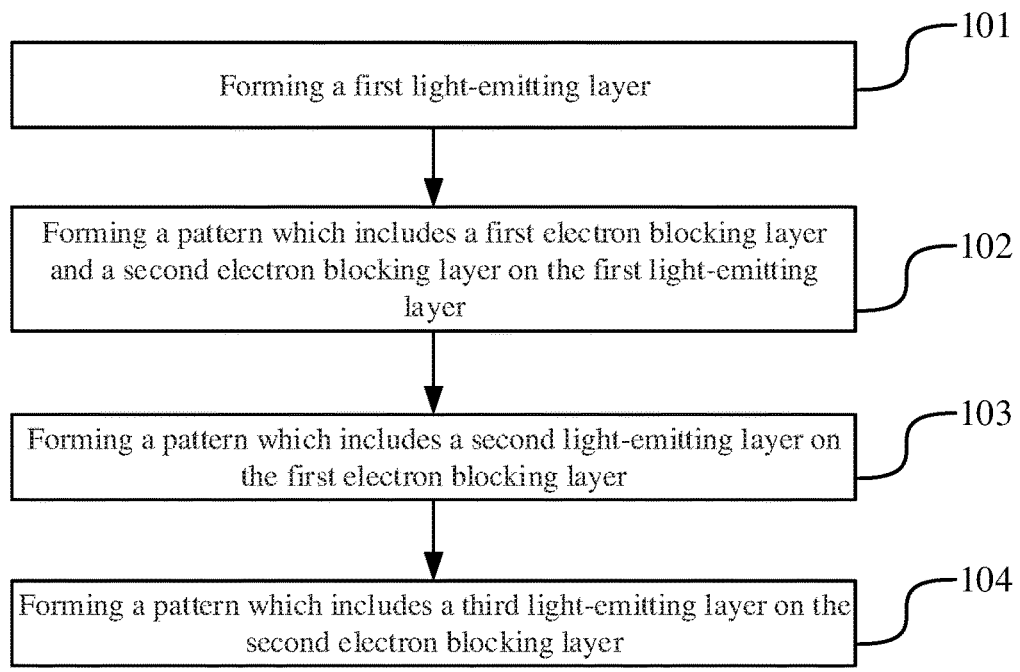
FIG. 15 is a schematic diagram of a process of a manufacturing method of a display substrate according to an embodiment of the present disclosure.

Based on the same invention concept, another embodiment of the present disclosure provides a manufacturing method of any of the above display substrates, which includes steps of forming the anode conductive layer, the organic functional layer and the cathode conductive layer. Here, referring to FIG. 15, forming the organic functional layer comprises the following steps.

In step 101, a first light-emitting layer is formed.

In step 102, a pattern which includes a first electron blocking layer and a second electron blocking layer is formed on the first light-emitting layer.

In step 103, a pattern which includes a second light-emitting layer is formed on the first electron blocking layer.

In step 104, a pattern which includes a third light-emitting layer is formed on the second electron blocking layer.

In a possible implementation, step 101 in which the first light-emitting layer is formed includes: forming the first light-emitting layer that covers an effective display area of the display substrate by adopting an open mask process.

It should be understood that the sequence of steps 103 and 104 may be interchanged and may be performed simultaneously. It should also be understood that the specific implementations of the examples of the manufacturing method in the embodiments of the present disclosure have been described in detail above and are not repeated here. According to the embodiments of the present disclosure, the use frequency of the fine metal mask process may be reduced without causing the defect of color mixing, which helps to improve the display performance and reduce the manufacturing difficulty of an OLED product.

Based on the same invention concept, another embodiment of the present disclosure provides a display device, including any one of the above display substrate. In an implementation, the display device can be a mobile phone, a tablet computer, a TV, a display, a laptop computer, a digital phone frame, a navigator, etc., having the product or part with a display function which includes a display panel.

Figure 16:
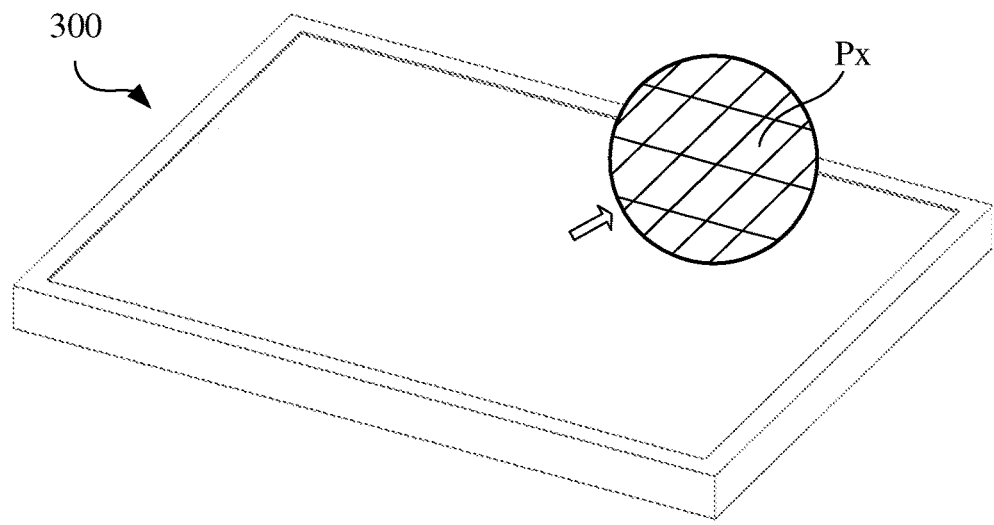
FIG. 16 is a structural schematic diagram of a display device according to an embodiment of the present disclosure.

FIG. 16 is a structural schematic diagram of a display device according to an embodiment of the present disclosure. Referring to FIG. 16, the display device 300 may include a plurality of sub-pixel areas Px arranged in rows and columns in the effective display area. Each of the sub-pixel areas Px is one of the first sub-pixel area P1, the second sub-pixel area P2 and the third sub-pixel area P3, such that the display device 300 can reduce the use frequency of the fine metal mask process without causing the defect of color mixing, which helps to improve the display performance and reduce the manufacturing difficulty of an OLED product.

The foregoing descriptions are only some embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display device, comprising: a base substrate;
an anode conductive layer;
a cathode conductive layer, wherein the cathode conductive layer and the anode conductive layer are at a same side in a thickness direction of the base substrate; and
an organic functional layer between the anode conductive layer and the cathode conductive layer, wherein
the display device comprises first sub-pixel units, second sub-pixels and third sub-pixels which correspond to blue, green and red, respectively, part of the organic functional layer in the first sub-pixel units comprises a third electron blocking layer and a first light-emitting layer formed on the third electron blocking layer,
part of the organic functional layer in the second sub-pixel units comprises the third electron blocking layer, the first light-emitting layer formed on the third electron blocking layer, a first electron blocking layer formed on the first light-emitting layer, and a second light-emitting layer formed on the first electron blocking layer, a light-emitting color of the first light-emitting layer is different from a light-emitting color of the second light-emitting layer, and none of the second light-emitting layer is in the first sub-pixel units and the third sub-pixel units, and
part of the organic functional layer in the third sub-pixel units comprises the third electron blocking layer, the first light-emitting layer formed on the third electron blocking layer, a second electron blocking layer formed on the first light-emitting layer, and a third light-emitting layer formed on the second electron blocking layer, a light-emitting color of the third light-emitting layer is different from the light-emitting colors of the first light-emitting layer and the second light-emitting layer, and none of the third light-emitting layer is in the first sub-pixel units and the second sub-pixel units.

2. The display device according to claim 1, wherein the third electron blocking layer fills an effective display area of the display device.

3. The display device according to claim 1, further comprising a reflecting layer at a side, away from the cathode conductive layer, of the anode conductive layer.

4. The display device according to claim 3, wherein the cathode conductive layer is configured for partial transmission and partial reflection of light emitted by the organic functional layer,
in the first sub-pixel units, a film thickness between the cathode conductive layer and the reflecting layer is a first thickness to enable light emitted from the first sub-pixel units is in the color category of the first sub-pixel unit, in the second sub-pixel units, a film thickness between the cathode conductive layer and the reflecting layer is a second thickness, to enable light emitted from the second sub-pixel units is in the color category of the second sub-pixel unit, and in the third sub-pixel units, a film thickness between the cathode conductive layer and the reflecting layer is a third thickness, to enable light emitted from the third sub-pixel units is in the color category of the third sub-pixel unit.

5. The display device according to claim 1, wherein materials for forming the first light-emitting layer, the second light-emitting layer and the third light-emitting layer comprise electroluminescent materials.

6. The display device according to claim 1, wherein materials for forming the first light-emitting layer and the second light-emitting layer comprise electroluminescent materials.

7. The display device according to claim 1, wherein the organic functional layer further comprises a third electron blocking layer at a side, close to the anode conductive layer, of the first light-emitting layer.

8. The display device according to claim 7, wherein the third electron blocking layer fills an effective display area of the display device.

9. The display device according to claim 1, wherein the first light-emitting layer fills an effective display area of the display device.

10. The display device according to claim 1, wherein the first light-emitting layer is made from an electroluminescent material of which a hole mobility is greater than an electron mobility.

11. A manufacturing method of a display device, comprising:
forming an anode conductive layer on a base substrate;
forming an organic functional layer;
forming a cathode conductive layer, the cathode conductive layer and the anode conductive layer being at the same side in a thickness direction of the substrate, and the organic functional layer being between the anode conductive layer and the cathode conductive layer, wherein
said forming the organic functional layer comprises:
forming a third electron blocking layer;
forming a first light-emitting layer on the third electron blocking layer, the display device comprising first sub-pixel units, second sub-pixels and third sub-pixels which correspond to blue, green and red, respectively, and part of the organic functional layer in the first sub-pixel units comprising the first light-emitting layer;
forming a pattern, which comprises a first electron blocking layer and a second electron blocking layer, on the first light-emitting layer;
forming a pattern, which comprises a second light-emitting layer, on the first electron blocking layer, wherein a light-emitting color of the first light-emitting layer is different from a light-emitting of the second light-emitting layer, the first light-emitting layer, the first electron blocking layer and the second light-emitting layer are sequentially laminated in a direction away from the anode conductive layer in the second sub-pixel units, and none of the second light-emitting layer is in the first sub-pixel units and the third sub-pixel units; and
forming a pattern, which comprises a third light-emitting layer, on the first electron blocking layer, wherein part of the organic functional layer in the third sub-pixel units comprises the first light-emitting layer, a second electron blocking layer and a third light-emitting layer that are sequentially laminated in the direction away from the anode conductive layer, a light-emitting color of the third light-emitting layer is different from the light-emitting colors of the first light-emitting layer and the second light-emitting layer, and none of the third light-emitting layer is in the first sub-pixel units and the second sub-pixel unit.

12. The manufacturing method according to claim 11, wherein
said forming the first light-emitting layer comprises:
forming the first light-emitting layer that fills an effective display area of the display device by adopting an open mask process.

13. The manufacturing method according to claim 11, wherein the organic functional layer further comprises a third electron blocking layer, and the third electron blocking layer is at a side, close to the anode conductive layer, of the first light-emitting layer, and fills an effective display area of the display device.

14. The manufacturing method according to claim 11, wherein a reflecting layer is formed on a side of the base substrate where the anode conductive layer is to be formed before forming the anode conductive layer on the base substrate.

15. The manufacturing method according to claim 14, wherein the cathode conductive layer is configured for partial transmission and partial reflection of light emitted by the organic functional layer,
in the first sub-pixel units, a film thickness between the cathode conductive layer and the reflecting layer is a first thickness to enable light emitted from the first sub-pixel units is in the color category of the first sub-pixel unit,
in the second sub-pixel units, a film thickness between the cathode conductive layer and the reflecting layer is a second thickness, to enable light emitted from the second sub-pixel units is in the color category of the second sub-pixel unit, and
in the third sub-pixel units, a film thickness between the cathode conductive layer and the reflecting layer is a third thickness, to enable light emitted from the third sub-pixel units is in the color category of the third sub-pixel unit.

16. The manufacturing method according to claim 11, wherein materials for forming the first light-emitting layer, the second light-emitting layer and the third light-emitting layer comprise electroluminescent materials.

17. The manufacturing method according to claim 11, wherein the organic functional layer further comprises a third electron blocking layer, and the third electron blocking layer is at a side, close to the anode conductive layer, of the first light-emitting layer.

18. The manufacturing method according to claim 17, wherein the third electron blocking layer fills an effective display area of the display device.

19. The manufacturing method according to claim 11, wherein the first light-emitting layer fills an effective display area of the display device.

20. The manufacturing method according to claim 11, wherein the first light-emitting layer is made from an electroluminescent material of which a hole mobility is greater than an electron mobility.

* * * * *